(12) United States Patent
Hatase (10) Patent No.: US 8,791,785 B2
(45) Date of Patent: Jul. 29, 2014

(54) METHOD FOR MANUFACTURING MODULE WITH PLANAR COIL, AND MODULE WITH PLANAR COIL

(75) Inventor: Minoru Hatase, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/613,023

(22) Filed: Sep. 13, 2012

(65) Prior Publication Data

US 2013/0002042 A1 Jan. 3, 2013

Related U.S. Application Data

(60) Division of application No. 13/197,810, filed on Aug. 4, 2011, now Pat. No. 8,294,546, which is a continuation of application No. PCT/JP2009/067843, filed on Oct. 15, 2009.

(30) Foreign Application Priority Data

Feb. 7, 2009 (JP) ................................. 2009-026824

(51) Int. Cl.
*H01F 5/00* (2006.01)
(52) U.S. Cl.
USPC .......................................................... 336/200
(58) Field of Classification Search
USPC ..................... 336/200, 233–234, 83; 257/531
See application file for complete search history.

(56) References Cited

U.S. PATENT DOCUMENTS

| 6,441,715 | B1 * | 8/2002 | Johnson ........................ 336/200 |
| 6,940,147 | B2 * | 9/2005 | Crawford et al. ............. 257/531 |
| 8,058,960 | B2 * | 11/2011 | Hebert et al. ................. 336/200 |
| 2006/0176137 | A1 | 8/2006 | Sato et al. |
| 2007/0040238 | A1 | 2/2007 | Yamasaki et al. |

FOREIGN PATENT DOCUMENTS

| CN | 1380690 A | 11/2002 |
| CN | 1388538 A | 1/2003 |
| CN | 1432966 A | 7/2003 |

OTHER PUBLICATIONS

Hatase; "Method for Manufacturing Module with Planar Coil, and Module with Planar Coil"; U.S. Appl. No. 13/197,810, filed Aug. 4, 2011.

* cited by examiner

*Primary Examiner* — Tuyen Nguyen
(74) *Attorney, Agent, or Firm* — Keating & Bennett, LLP (57) ABSTRACT

A method for manufacturing a module including a planar coil, and a module including a planar coil, reduce manufacturing cost and also are able to handle a large current. The method for manufacturing the module including the planar coil includes the steps of providing a second resin layer including a magnetic filler on a first resin layer with a built-in chip-type electronic component; providing a planar coil on the second resin layer; and providing a third resin layer including a non-magnetic property so as to coat the planar coil.

8 Claims, 6 Drawing Sheets

METHOD FOR MANUFACTURING MODULE WITH PLANAR COIL, AND MODULE WITH PLANAR COIL

BACKGROUND OF THE INVENTION

1. Field of the Invention

The present invention relates to a method for manufacturing a module including a planar coil, and a module including a planar coil.

2. Description of the Related Art

Figure 10:
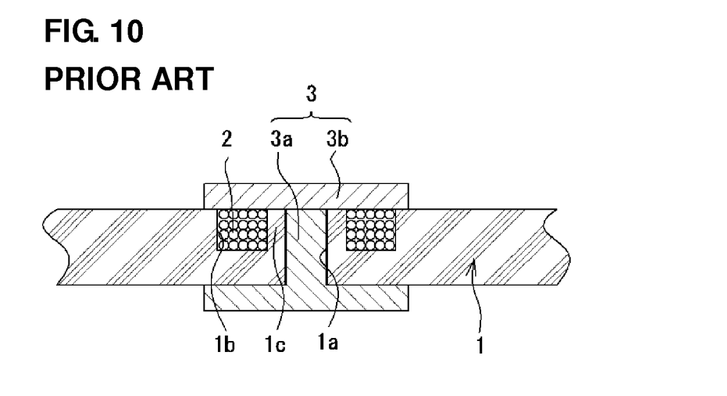
FIG. 10 is a sectional view showing a principal section of a printed wiring board with a conventional coil built therein.

For example in Japanese Patent Application Laid-Open No. H7-283029, a printed wiring board with a built-in inductor is proposed. This printed wiring board with a built-in inductor will be described based on FIG. 10. As shown in FIG. 10, a through hole 1a in a predetermined shape is formed in a printed wiring board 1. An annular counterbore section 1b is formed outside the through hole 1a, and an annular insulating wall 1c lies between the counterbore section 1b and the through hole 1a. A coil 2 is mounted on the counterbore section 1b. A winding coated with an insulating film is wound to form the coil 2. Further, a first core member 3a with a plain plate is mounted with respect to the through hole 1a in the printed wiring board 1 from the lower surface side thereof, and a second core member 3b in a planar shape which is opposed to the first core member 3a is arranged on the top surface of the printed wiring board 1. A planar section of the first core member 3a is bonded to the printed wiring board 1, and the second core member 3b is bonded to the first core member 3a and the printed wiring board 1, to unify the first and second core members 3a, 3b as a core 3.

However, in the case of the conventional printed wiring board with a built-in inductor shown in FIG. 10, a significant amount of time and work is required to form the counterbore section 1b in the printed wiring board 1 for the purpose of mounting the coil 2, thereby increasing manufacturing cost of the printed wiring board 1 with a built-in inductor. Further, since the through hole 1a in the printed wiring board 1 is mounted with the first core member 3a which penetrates the through hole and the first core member 3a is joined with the second core member 3b, the core 3 ultimately becomes thick, which is not preferred in a scene where a reduced profile is required. Moreover, since the coil 2 is formed of a winding, it cannot cope with a large current.

SUMMARY OF THE INVENTION

In order to solve the above problems, preferred embodiments of the present invention provide a method for manufacturing a module including a planar coil, and a module including a planar coil, capable of reducing manufacturing cost and also coping with a large current.

A method for manufacturing a module including a planar coil according to a preferred embodiment of the present invention includes the steps of: providing a second resin layer, which includes a magnetic property or a non-magnetic property, on a first resin layer including a built-in chip-type electronic component; providing a planar coil on the second resin layer; and providing a third resin layer, which includes a magnetic property or a non-magnetic property, so as to coat the planar coil.

Further, it is preferable that, simultaneously with provision of the planar coil on the second resin layer, a magnetic core be provided in a core portion of the coil.

Further, it is preferable that, after provision of the planar coil and the magnetic core on the second resin layer in an uncured state and then curing of the second resin layer, the third resin layer in the uncured state be provided so as to coat the planar coil and the magnetic core, to planarize the surface of the third resin layer with the magnetic core used as a spacer.

Moreover, a module including a planar coil according to a preferred embodiment of the present invention includes: a first resin layer including a built-in chip-type electronic component; a second resin layer including a magnetic property or a non-magnetic property, and arranged on the first resin layer; a planar coil arranged on the second resin layer; and a third resin layer including a magnetic property or a non-magnetic property, and coating the planar coil.

Further, it is preferable that a magnetic core be provided in a core portion of the planar coil.

Further, it is preferable that the surface of the magnetic core be exposed to the surface of the third resin layer.

Further, it is preferable that the second resin layer be a magnetic resin layer including a magnetic filler.

Further, it is preferable that the third resin layer be a non-magnetic resin layer, and the planar coil function as an antenna.

Further, it is possible that the planar coil is configured as an electric power transmission coil of a non-contact type electric power transmission device, and the device is configured as a non-contact type electric power transmission module including the electric power transmission coil and a transmission circuit, or the electric power transmission coil and a reception circuit.

Further, according to a preferred embodiment of the present invention, it is possible that the third resin layer is formed as a magnetic resin layer, and the planar coil is configured so as to function as an inductor.

Further, it is possible that the planar coil is used as an inductor of a filter circuit including the inductor and a capacitor.

According to a preferred embodiment of the present invention, it is possible to provide a method for manufacturing a module including a planar coil, and a module including a planar coil, capable of reducing manufacturing cost and also coping with a large current.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a method for manufacturing a module including a planar coil and a module including a planar coil of the present invention will be described based on FIGS. 1A to 9.

First, a module including a planar coil in a first preferred embodiment will be described based on FIGS. 1A and 1B, and thereafter, a method for manufacturing the module including the planar coil shown in FIGS. 1A and 1B will be described based on FIGS. 2A to 2F. Further, a module including a planar coil in each of second to eighth preferred embodiments will be described based on FIGS. 3 to 9.

First Preferred Embodiment

Figure 1A:
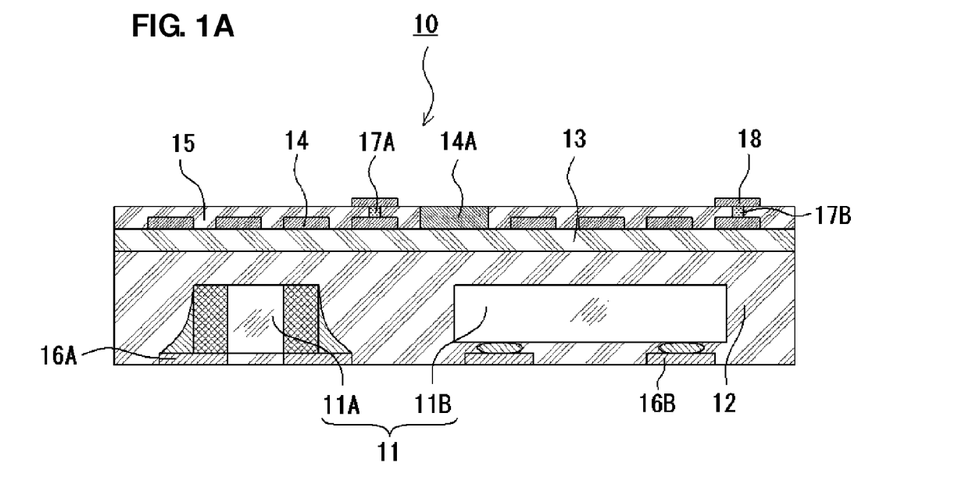
FIG. 1A is a sectional view showing a preferred embodiment of a module including a planar coil of the present invention.
Figure 1B:
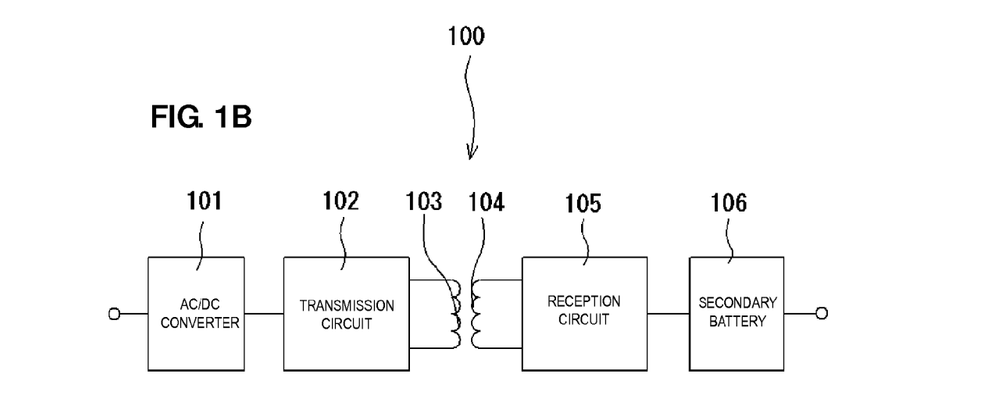
FIG. 1B is a block diagram showing an example of a non-contact type power electric transmission device, to which the module including the planar coil shown in FIG. 1A has been applied.

A module 10 including a planar coil of the present preferred embodiment preferably includes a first resin layer 12 including a built-in chip-type electronic component 11; a second resin layer 13 arranged on the first resin layer 12 and containing a magnetic filler; a spiral planar coil 14 arranged on the second resin layer 13; and a third resin layer 15 including a non-magnetic property and coating the planar coil 14, for example as shown in FIG. 1A, the module 10 preferably being configured as a non-contact type electric power transmission module 100, for example as shown in FIG. 1B.

Further, as shown in FIG. 1A, a magnetic core 14A is arranged in a central portion (core portion) of the spiral of the planar coil 14, and the magnetic core 14A preferably has a larger thickness than a thickness of the planar coil 14. The planar coil 14 is buried inside the third resin layer 15, while the top surface of the magnetic core 14A is exposed from the top surface of the third resin layer 15. Arranging the magnetic core 14A in the core portion of the planar coil 14 in this manner can enhance an L value of the planar coil 14.

As shown in FIG. 1A, the chip-type electronic component 11 preferably includes a chip-type passive electronic component 11A such as a chip-type capacitor or a chip-type inductor and a chip-type active electronic component 11B such as a chip-type integrated circuit component. FIG. 1 shows the chip-type laminated capacitor or the chip-type inductor as the chip-type passive electronic component 11A, and the chip-type integrated circuit component (hereinafter referred to as an "IC chip" as required) as the chip-type active electronic component 11B. The chip-type electronic component 11 is not restricted to the kind and the number of pieces shown in FIG. 1A, and an appropriate number of the chip-type passive electronic components 11A and chip-type active electronic components 11B are selected and provided in accordance with an intended use of the module 10 including the planar coil.

In the present preferred embodiment, the first resin layer 12 is preferably a composite resin layer including the non-magnetic property and obtained by mixing a non-magnetic filler such as alumina or a silica and a thermosetting resin at a predetermined ratio. Forming the first resin layer 12 of the composite layer can improve thermal conductivity so as to efficiently dissipate heat generated from the chip-type electronic component 11. It is to be noted that the first resin layer 12 may be a resin layer formed solely of the thermosetting resin.

Further, as shown in FIG. 1A, on the under surface of the first resin layer 12, terminal electrodes 16A, 16B respectively mounted with the chip-type passive electronic component 11A and the chip-type active electronic component 11B are arranged. These terminal electrodes 16A, 16B are exposed from the under surface of the first resin layer 12, and are used at the time of connecting the module 10 including the planar coil to a substrate such as a mother board.

The second resin layer 13 preferably includes a composite resin layer including a magnetic property and obtained by mixing the magnet filler such as ferrite and the thermo-setting resin at a predetermined ratio. With the second resin layer 13 including a magnetic property, it is possible to prevent or suppress an outflow of a magnetic flux, generated in the planar coil 14, to the first resin layer 12 side. The second resin layer 13 is preferably formed of the same resin or the same kind of resin as the thermosetting resin of the first resin layer 12, and in this manner, a joint strength between the second resin layer 13 and the first resin layer 12 can be improved, thereby to prevent peeling therebetween. This also applies to a later-mentioned third resin layer 15. Further, with the second resin layer 13 formed of the composite resin, it is possible to efficiently dissipate heat generated from the chip-type electronic component 11, as in the first resin layer 12.

The planar coil 14 preferably includes a metal plate or a metal wire of copper or the like, for example. With the planar coil 14 including such a metal plate or a metal wire, it is possible to reduce resistance so as to allow a large current to flow. The magnetic core 14A arranged in the core portion of the planar coil 14 preferably includes a magnetic block of ferrite or the like, for example. Forming the magnetic core 14A of the magnetic block can increase a magnetic permeability and a saturated magnetic flux density, thereby to enhance an L value and a Q value of the planar coil 14.

In the present preferred embodiment, the third resin layer 15 preferably is formed of a composite resin including the non-magnetic property and obtained by mixing the non-magnetic filler and the thermosetting resin at a predetermined ratio, as with the first resin layer 12. Although the third resin layer 15 coats throughout the planar coil 14, only the top surface of the magnetic core 14A is exposed on the top surface of the third resin layer 15 as described above. The third resin layer 15 is also preferably formed of the same resin or the same kind of resin as the thermosetting resin of the first and second resin layers 12, 13. In addition, the third resin layer 15 may also be a resin layer formed solely of the thermosetting resin.

Further, as shown in FIG. 1A, via hole conductors 17A, 17B are formed in portions of the third resin layer 15 which correspond to the inner end and the outer end of the planar coil 14. These via hole conductors 17A, 17B are electrically connected with the planar coil 14 and routing wiring 18 disposed on the top surface of the third resin layer 15.

The module 10 including the planar coil as thus configured is, for example, configured as a non-contact type electric power transmission module. The non-contact type electric power transmission module preferably includes an electric power transmission coil including the magnetic core 14A and the planar coil 14; and a non-contact type transmission circuit or a non-contact type reception circuit including a plurality of chip-type electronic components 11, the module being configured so as to transmit or receive predetermined electric power via the planar coil 14.

The module 10 including the planar coil in the present preferred embodiment is applicable as the non-contact type electric power transmission device 100 shown in FIG. 1B. As shown in the figure, this non-contact type electric power transmission device 100 includes: an AC/DC converter 101 which converts an alternating current voltage to a direct-current voltage; a transmission circuit 102 which generates an alternating current voltage based on a direct current outputted from the AC/DC converter 101; a primary coil 103 to which the alternating current voltage flows from the transmission circuit 102 and which then generates a magnetic flux; a secondary coil 104 in which the alternating current voltage is induced based on the magnetic flux from the primary coil 103; and a reception circuit 105 which rectifies the alternating current voltage of the secondary coil 104, to output the direct-current voltage, the device 100 being configured so as to charge a secondary battery 106 with the direct-current voltage outputted from the reception circuit 105.

In the module 10 including the planar coil in the present preferred embodiment, the chip-type electronic component 11 built in the first resin layer 12 is configured as the non-contact type transmission circuit or the non-contact type reception circuit, and the planar coil 14 is configured as the primary coil 103 or the secondary coil 104. Then, the primary coil 103 and the secondary coil 104 are opposed to each other via a predetermined distance, so that predetermined alternating current power can be transmitted from the primary coil 103 to the secondary coil 104 in a non-contact manner.

Figure 2A:
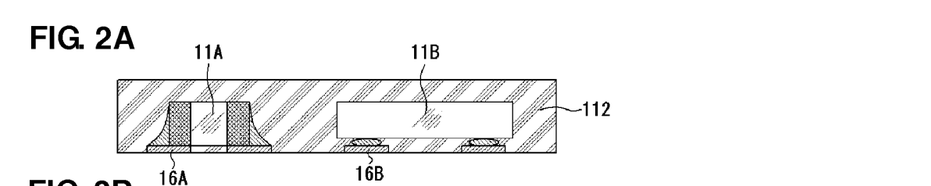
FIGS. 2A to 2F are step views each showing a preferred embodiment of a method for manufacturing a module including the planar coil shown in FIG. 1.

Next, a method for manufacturing the module 10 including the planar coil in the present preferred embodiment will be described based on FIGS. 2A-2F. First, the first resin layer 12 including the built-in chip-type electronic component 11 shown in FIG. 2A is produced. For example, a stainless-made plate is prepared and metal foil such as copper foil is pasted on the top surface of this plate, to form the terminal electrodes 16A, 16B having a predetermined pattern by photography technique. Subsequently, for example, after mounting of the chip-type capacitor 11A and the IC chip 11B respectively on the terminal electrodes 16A, 16B, a composite resin sheet in a half-cured state which includes the non-magnetic filler is thermally compressed to the chip-type electronic component 11, to obtain a first resin layer 112 in an uncured state with the built-in chip-type electronic component 11, as shown in FIG. 2A.

Figure 2B:
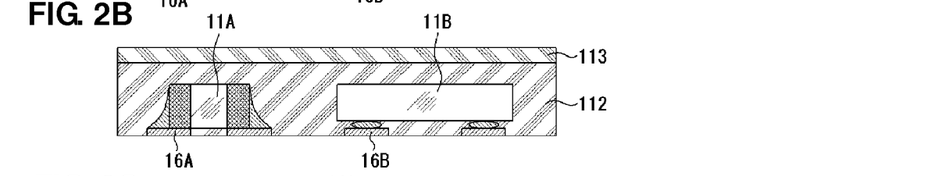

Next, as shown in FIG. 2B, a composite resin sheet in the half-cured state which includes the magnetic filler is thermally compressed to the top surface of the first resin layer 112 in the uncured state, to superimpose a second resin layer 113 in the uncured state on the first resin layer 112 in the uncured state.

Figure 2C:
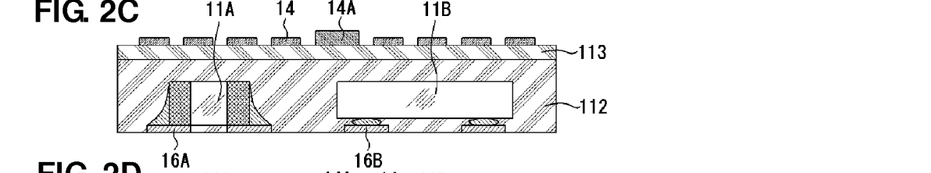

Subsequently, as shown in FIG. 2C, after arrangement of the planar coil 14, formed, for example, by bending of a metal plate, in a predetermined position of the second resin layer 113 in the uncured state and arrangement of the magnetic core 14A with a larger thickness than that of the planar coil 14 in the core portion of the planar coil 14, the first and second resin layers 112, 113 in the uncured state are thermally cured. The planar coil 14 has a larger thickness than that of a coil obtained by patterning of metal foil by etching technique or a coil formed by printing of a conductive paste, and can make resistance small and thus cope with a large current.

Figure 2D:
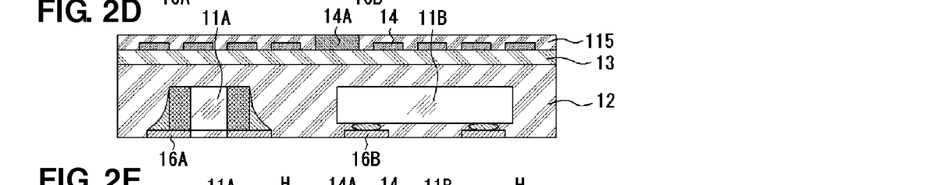

Further, as shown in FIG. 2D, a composite resin sheet in the half-cured state which includes the non-magnetic filler is thermally compressed to the top surface of the second resin layer 13. At this time, when the top surface of the composite resin sheet is planarized using a press, the magnetic core 14A acts as a spacer, thereby allowing the planar coil 14 to be buried inside the composite resin sheet, and also allowing the top surface of the magnetic core 14A to be exposed from the top surface of the composite resin sheet, so as to obtain a third resin layer 115 in the uncured state which has a uniform thickness.

Figure 2E:
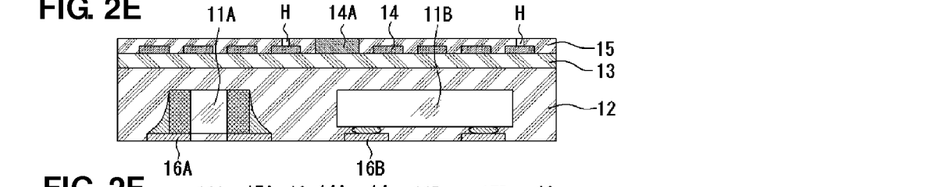

Next, after thermal curing of the third resin 115 in the uncured state to obtain the third resin layer 15, as shown in FIG. 2E, portions corresponding to the inner end and the outer end of the planar coil 14 are irradiated with lasers, to form via holes H.

Figure 2F:
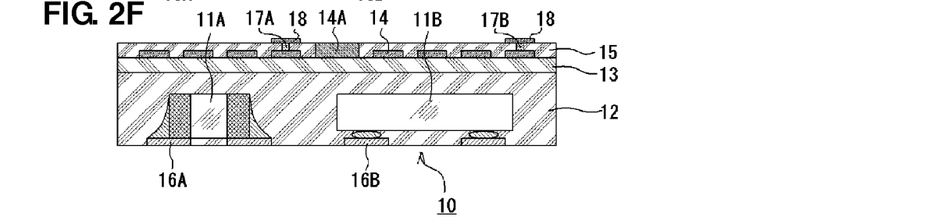

Then, plate processing is performed on the top surface of the third resin layer 15, to bury conductive metal into the via holes H, thereby forming the via hole conductors 17A, 17B, and also to form a conductive metal film on the top surface of the third resin layer 15, and further, as shown in FIG. 2F, the conductive metal film is patterned preferably by a photolithography technique, for example, to form the routing wiring 18. Thereby, the planar coil 14 is connected to the routing wiring 18 via the via hole conductors 17A, 17B so that the module 10 including the planar coil in the present preferred embodiment can be obtained.

As thus described, the method for manufacturing the module including the planar coil in the present preferred embodiment includes the steps of: providing the second resin layer 13 including the magnetic filler on the first resin layer including the built-in chip-type electronic component 11; providing the planar coil 14 on the second resin layer 12; and providing the third resin layer 15 including the non-magnetic property so as to coat the planar coil 14, whereby the module 10 including the planar coil in the present preferred embodiment can be manufactured with ease at low cost without a through hole, a counterbore section and the like being provided for provision of a coil.

Further, according to the present preferred embodiment, simultaneously with provision of the planar coil 14 on the second resin layer 13, the magnetic core 14A is provided in the core portion of the planar coil 14, whereby the step of providing the planar coil 14 and the magnetic core 14A can be simplified, to enhance efficiency in operation of mounting the coil.

Further, after provision of the planar coil 14 and the magnetic core 14A on the second resin layer 113 in the uncured state and then curing of the second resin layer 113 in the uncured state, the third resin layer 115 in the uncured state is provided so as to coat the planar coil 14 and the magnetic core 14A, to planarize the surface of the third resin layer with the magnetic core 14A used as a spacer, whereby the third resin layer adjusted to have a fixed film thickness can be obtained without use of a specific spacer for planarizing the third resin layer 15.

Further, the module 10 including the planar coil, which is manufactured by the manufacturing method of the present preferred embodiment, preferably includes the first resin layer 12 including the built-in chip-type electronic component 11; the second resin layer 13 arranged on the first resin layer 12 and including the magnetic filler; the planar coil 14 arranged on the second resin layer 13; and the third resin layer 15 including the non-magnetic property and coating the planar coil 14, and can thereby cope with a large current with a simple structure, and further promote reduction in profile of the module.

Further, it is preferable that the third resin layer 15 is a non-magnetic resin layer, and the planar coil 14 functions as an antenna pattern, and can thus be used for transmission and reception of electromagnetic waves. Moreover, the planar coil 14 is electric power transmission coils 103, 104 of the non-contact type electric power transmission device 100, and is configured as a non-contact type electric power transmission module including the electric power transmission coil 103 and the transmission circuit 102 or the reception circuit 105, whereby it is possible to transmit electric power in a short amount of time, and can, for example, be charged in the secondary battery 106 in a short amount of time. Further, the second resin layer 13 including the magnetic property lies between the first resin layer 12 with the built-in chip-type electronic component 11 and the third resin layer 15 in which the planar coil 14 is buried, whereby it is possible to prevent or suppress magnetic influences of the planar coil 14 on the chip-type electronic component 11.

Further, according to the present preferred embodiment, since the magnetic core 14A is provided in the core portion of the planar coil 14, it is possible to obtain the module 10 including the planar coil which is excellent in L value and Q value.

Second Preferred Embodiment

Figure 3:
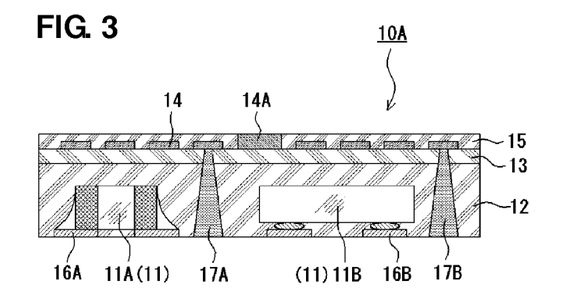
FIG. 3 is a sectional view showing another preferred embodiment of the module including the planar coil of the present invention.

A module 10A including a planar coil in the present preferred embodiment is configured in a similar manner to the module 10 including the planar coil in the first preferred embodiment except that the configurations of the via hole conductors 17A, 17B are different, for example as shown in FIG. 3. Therefore in the present preferred embodiment, identical or corresponding portions to those in the first preferred embodiment are described as provided with identical numerals.

In the present preferred embodiment, the via hole conductors 17A, 17B penetrate the first and second resin layers 12, 13, and are connected to the under surfaces of the inner end and the outer end of the planar coil 14. Therefore, routing wiring that connects the via hole conductors 17A, 17B is formed on the side of the substrate (not shown), such as the mother board, which is mounted with the module 10A including the planar coil. This routing wiring may be provided on the under surface of the first resin layer 12. In the case of providing the routing wiring on the under surface of the first resin layer 12, it can be provided along with the terminal electrodes 16A, 16B mounted on the chip-type electronic component 11.

In the case of manufacturing the module 10A including the planar coil in the present preferred embodiment, the steps up to provision of the via hole conductors 17A, 17B are performed in a similar manner to the case of manufacturing the module 10 including the planar coil in the first preferred embodiment. In the case of providing the via hole conductors 17A, 17B, after thermal curing of the first, second and third resin layers 12, 13, 15, portions corresponding to the inner end and the outer end of the planar coil 14 are irradiated with lasers from the under surface side of the first resin layer 12, to form via holes that penetrate the first and second resin layers 12, 13 and reach the respective under surfaces of the inner end and the outer end of the planar coil 14, and the insides of these via holes are respectively filled with a conductive paste, and then cured, to form the via hole conductors 17A, 17B. It is thereby possible to obtain the module 10A including the planar coil in the present preferred embodiment.

A similar functional effect can also be expected in the present preferred embodiment to that of the module 10A including the planar coil in the first preferred embodiment.

Third Preferred Embodiment

Figure 4:
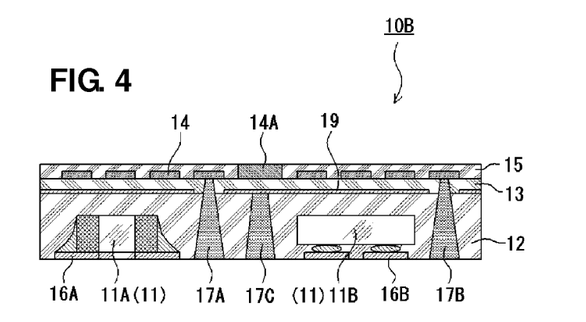
FIG. 4 is a sectional view showing still another preferred embodiment of the module including the planar coil of the present invention.

A module 10B including a planar coil in the present preferred embodiment is configured basically in a similar manner to the module 10A including the planar coil (see FIG. 3) in the second preferred embodiment except that a shield layer 19 is provided on an interface between the first and second resin layers 12, 13, and a second via hole conductor 17C is electrically connected to this shield layer 19 as a grounding conductor, for example, as shown in FIG. 4. It is to be noted that also in the present preferred embodiment, identical or corresponding portions to those in the second preferred embodiment are described as provided with identical numerals.

In the case of providing a plated film or metal foil as the shield layer 19, after provision of the plated film or the metal foil throughout the top surface of the second resin layer 13, patterning is performed preferably by a photolithography technique, for example, so that holes to be penetrated by the via hole conductors 17A, 17B can be provided. Further, in the case of providing a conductive film as the shield layer 19, a conductive paste is printed in a predetermined pattern, so that holes to be penetrated by the via hole conductors 17A, 17B can be provided. Moreover, the second via hole conductor 17C can be provided in a similar manner to the via hole conductors 17A, 17B.

Since the shield layer 19 is provided using the plated film, the metal foil or the conductive film on the interface between the first and second resin layers 12, 13, electromagnetic interference between the chip-type electronic component 11 inside the first resin layer 12 and the planar coil 14 inside the third resin layer 15 can be prevented.

Therefore, in the present preferred embodiment, the electromagnetic interference between the chip-type electronic component 11 and the planar coil 14 can be prevented by the shield layer 19 as described above, and other than that, a similar functional effect can also be expected in the present preferred embodiment to that of the module 10A including the planar coil in the second preferred embodiment.

Fourth Preferred Embodiment

Figure 5:
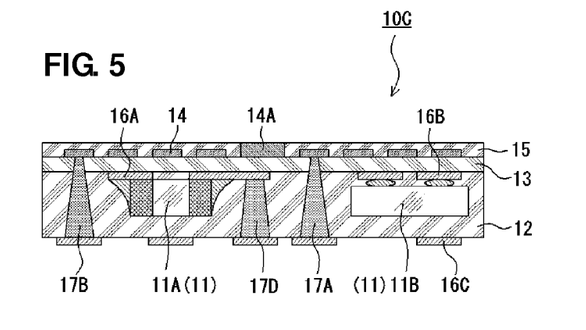
FIG. 5 is a sectional view showing still another preferred embodiment of the module including the planar coil of the present invention.

In the case of a module 10C including a planar coil in the present preferred embodiment, it is configured basically in a similar manner to the module 10A including the planar coil (see FIG. 3) in the second preferred embodiment except that the first resin layer 12 with the built-in chip-type electronic component 11 is arranged in a vertically reverse direction to the module 10B including the planar coil in the second preferred embodiment, for example as shown in FIG. 5. It is to be noted that also in the present preferred embodiment, identical or corresponding portions to those in the second preferred embodiment are described as provided with identical numerals.

Further, one terminal electrode 16A mounted on the chip-type capacitor 11A is extended in a direction toward the IC chip 11B. This extended section of the terminal electrode 16A is connected with a second via hole conductor 17D reaching the under surface of the first resin layer 12. Moreover, on the under surface of the first resin layer 12, a connection terminal electrode 16C is formed to have a predetermined pattern. The module 10C including the planar coil in the present preferred embodiment is mounted on the substrate such as the mother board via the connection terminal electrode 16C. In other respects, the module including the planar coil in the present preferred embodiment is also configured in a similar manner to the second preferred embodiment.

According to the present preferred embodiment, since the terminal electrodes 16A, 16B of the chip-type electronic component 11 are arranged inside the module 10C including the planar coil, the flexibility of layout of the connection terminal electrode 16C can be enhanced without restriction on the arranged position of the chip-type electronic component 11, and other than that, a similar functional effect to that in the second preferred embodiment can be expected.

Fifth Preferred Embodiment

Figure 6:
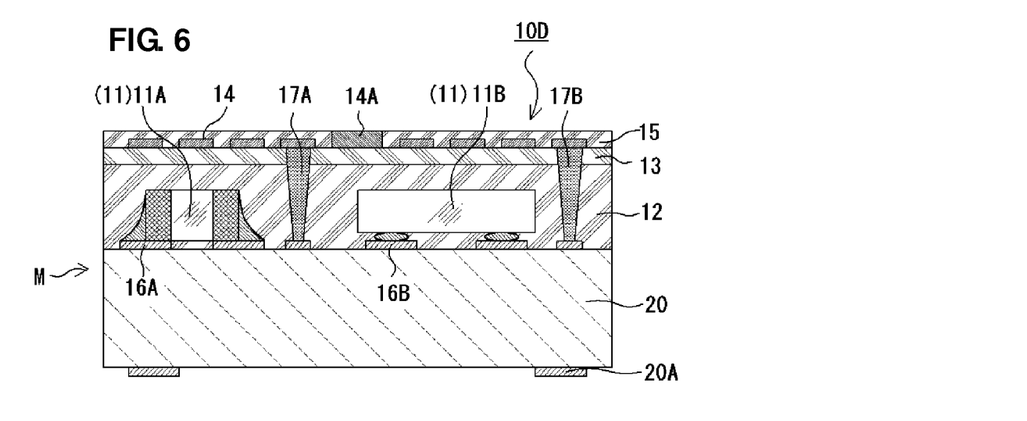
FIG. 6 is a sectional view showing still another preferred embodiment of the module including the planar coil of the present invention.

A module 10D including a planar coil in the present preferred embodiment is configured in a similar manner to the module 10A including the planar coil (See FIG. 3) in the second preferred embodiment except that configurations of the via hole conductors 17A, 17B are different, for example, as shown in FIG. 6, and supported by a core substrate (e.g., ceramic multi-layered substrate) 20. Therefore, also in the present preferred embodiment, identical or corresponding portions to those in the second preferred embodiment are described as provided with identical numerals.

In the ceramic multi-layered substrate 20, passive electronic components (not shown) such as a variety of wiring, a capacitor and an inductor are built. Mounting the module 10D including the planar coil on this ceramic multi-layered substrate 20 can give a highly functional small-sized module M. Further, a connection terminal 20A is formed to have a predetermined pattern on the under surface of the ceramic multi-layered substrate 20, and the module M is mounted on the substrate such as the mother board via the connection terminal 20A.

Since the module 10D including the planar coil in the present preferred embodiment has the via hole conductors 17A, 17B arranged upside down from those in the second preferred embodiment as described above, a manufacturing method for this module is slightly different from the manufacturing method for the module 10A including the planar coil in the second preferred embodiment.

That is, in the case of manufacturing the module M, first, the first resin layer 12 including the built-in chip-type electronic component 11 and the second resin layer 13 are sequentially provided on the top surface of the ceramic multi-layered substrate 20 in the manner shown in FIG. 2. Subsequently, portions on the top surface of the second resin layer 13 which correspond to the inner end and the outer end of the planar coil 14 are respectively irradiated with lasers, to form via holes. With the lasers applied from the top surface side of the second resin layer 13 in this manner, a vertical direction of each of the via holes is opposite to that in the case of the second preferred embodiment. After filling of these via holes with a conductive paste and curing thereof to form the via hole conductors 17A, 17B, the planar coil 14 and the magnetic core 14A are provided on the top surface of the second resin layer 13. At this time, the inner end and the outer end of the planar coil 14 are joined to the respective via hole conductors 17A, 17B. Subsequently, the third resin layer 15 coating the planar coil 14 is provided so that the module M can be obtained.

According to the present preferred embodiment, the module 10D including the planar coil is mounted on the ceramic multi-layered substrate 20 including built-in passive electronic components such as the capacitor and the inductor, to configure the module M, and it is thereby possible to make the module M highly functional and small-sized.

Sixth Preferred Embodiment

Figure 7:
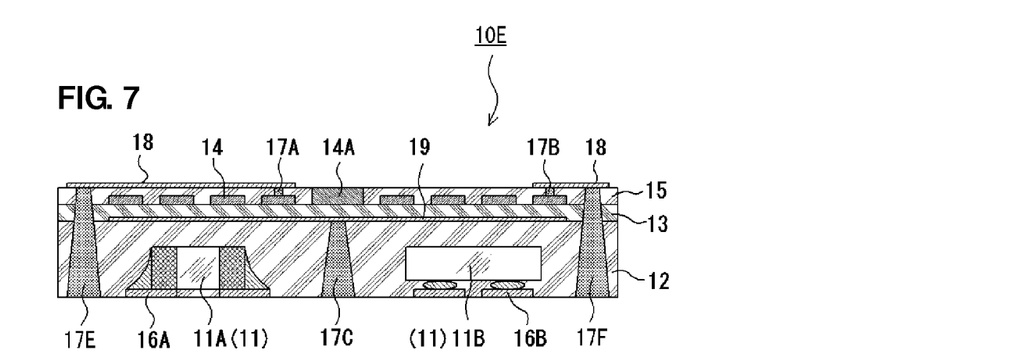
FIG. 7 is a sectional view showing still another preferred embodiment of the module including the planar coil of the present invention.

A module 10E including a planar coil in the present preferred embodiment is configured basically in a similar manner to the module 10A including the planar coil (See FIG. 3) in the second preferred embodiment except that the routing wiring 18 for connecting the planar coil 14 to the substrate such as the mother board is provided on the top surface of the third resin layer 15, and second via hole conductors 17E, 17F are drooped from the routing wiring 18 toward the substrate such as the motherboard, for example, as shown in FIG. 7. Therefore, also in the present preferred embodiment, identical or corresponding portions to those in the second preferred embodiment are described as provided with identical numerals.

That is, as in the case shown in FIG. 1, the inner end and the outer end of the planar coil 14 are respectively connected to the routing wiring 18 formed on the top surface of the third resin layer 15 in a predetermined pattern via the via hole conductors 17A, 17B. Outside the planar coil 14, this routing wiring 18 is connected to the third via hole conductors 17E, 17F that penetrate the third, second and first resin layers 15, 13, 12. It is to be noted that the second via hole conductor 17C defines a grounding conductor on the shield layer 19 provided at the interface between the first resin layer 12 and the second resin layer 13 in a similar manner to the module 10B including the planar coil in the third preferred embodiment.

In the case of providing the third via hole conductors 17E, 17F, it is possible to provide via holes penetrating the first, second and third resin layers 12, 13, 15, and further to increase an output of the laser, thereby forming a via hole with a small diameter in a short amount of time. On the other hand, as in the case of the second via hole conductor 17C, when there is an object film that cannot be damaged, such as the shield layer 19, in a destination of the laser, the output of the laser needs to be reduced, thereby increasing a diameter size of the via hole, and further requiring a long amount of time for formation of the via hole.

According to the present preferred embodiment, the routing wiring 18 of the planar coil 14 can be routed to the side of the substrate such as the mother board through the third via hole conductors 17E, 17F.

Seventh Preferred Embodiment

Figure 8A:
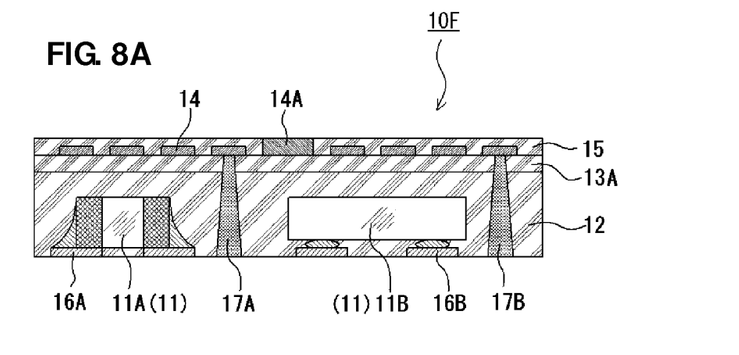
FIG. 8A is a sectional view showing still another preferred embodiment of the module including the planar coil of the present invention.

A module 10F including a planar coil in the present preferred embodiment is configured with substantially an identical structure to that of the module 10A including the planar coil in the second preferred embodiment except that the third resin layer 15 is formed of a resin layer containing the magnetic filler, for example as shown in FIG. 8A. Therefore, also in the present preferred embodiment, identical or corresponding portions to those in the second preferred embodiment are described as provided with identical numerals.

The planar coil 14 is configured as an antenna in the second preferred embodiment, whereas the planar coil 14 is configured as an inductor in the present preferred embodiment. The module 10F including the planar coil in the present preferred embodiment is configured as a DC-DC converter as shown in FIG. 8B.

Figure 8B:
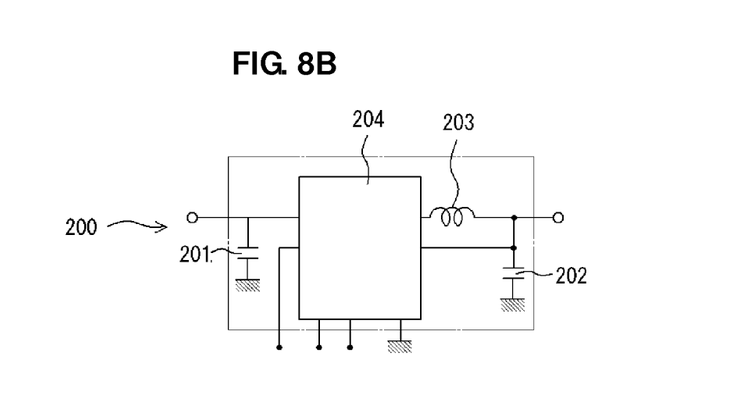
FIG. 8B is a block diagram showing an example where the module including the planar coil shown in FIG. 8A is configured as a DC-DC converter.

The DC-DC converter 200 shown in FIG. 8B is configured including an input-side capacitor 201, an output-side capacitor 202, an inductor 203, and an IC chip 204 as a control circuit.

In the DC-DC converter 200, a direct current input voltage $V_{IN}$ is inputted, and switched by a field-effect transistor (hereinafter referred to as "switching element") inside the IC chip 204. When the time when the switching element is held on is $T_{ON}$ and the time when it is held off is $T_{OFF}$, the output voltage $V_{OUT}$ is expressed by: $V_{OUT}=T_{ON}/(T_{ON}+T_{OFF})\times V_{IN}$, and the output voltage $V_{OUT}$ is dropped by the input voltage $V_{IN}$. When the input voltage $V_{IN}$ fluctuates, a stable output voltage $V_{OUT}$ is output by adjusting a ratio between $T_{ON}$ and $T_{OUT}$. The input-side capacitor 201 is used for stabilization of the input voltage $V_{IN}$ during transition and prevention of a voltage spike. On the output side, a filter circuit to output a direct current voltage is provided. This filter circuit is configured in combination with the inductor 203 which stores and releases current energy, and the output-side capacitor 202 which stores and releases voltage energy.

The chip-type electronic component 11 built in the first resin layer 12 of the module 10F including the planar coil in the present preferred embodiment is configured as the input-side capacitor 201, the output-side capacitor 202 and the IC chip 204. The planar coil 14 is then configured as the inductor 203. Herein, the planar coil 14 is buried inside the second and third resin layers 13, 15 vertically including magnetic properties, and it is thereby possible to trap a magnetic flux generated in the planar coil 14, so as to increase an L value and a Q value as the inductor.

According to the present preferred embodiment, since the planar coil 14 with high L value and Q value is provided as the output inductor which constitutes the DC-DC converter 200, it is possible to constitute the DC-DC converter 200 with high conversion efficiency.

Figure 9:
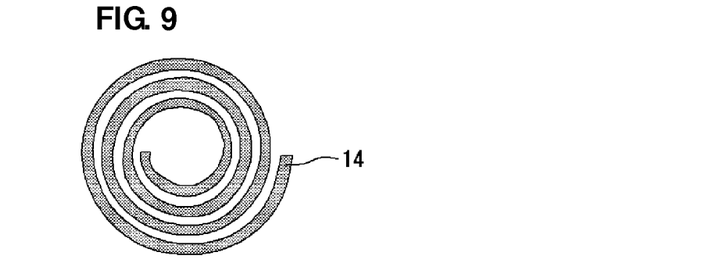
FIG. 9 is a plan view showing another planar coil for use in the module including the planar coil according to a preferred embodiment of the present invention.

In addition, the planar coil 14 for use in each of the above preferred embodiments is preferably a mosquito coil, for example, as shown in FIG. 9.

It is to be noted that each of the above preferred embodiments causes no restriction on the present invention, and each of the constitutional elements can be appropriately changed in design as required.

Preferred embodiments of the present invention can be preferably applied to electronic equipment including a built-in coil, such as a non-contact type electric power transmission device and a DC-DC converter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A module including a planar coil, comprising:
    a first resin layer including a non-magnetic property, an upper surface and an under surface that are opposed to each other, a built-in chip-type electronic component, and a terminal electrode electrically connected to the built-in chip-type electronic component and exposed from the under surface of the first resin layer;
    a second resin layer including a magnetic property, and arranged on the upper surface of the first resin layer;
    a planar coil arranged on the second resin layer; and
    a third resin layer including a magnetic property or a non-magnetic property, and coating the planar coil.

2. The module including the planar coil according to claim 1, wherein a magnetic core is provided in a core portion of the planar coil.

3. The module including the planar coil according to claim 2, wherein a surface of the magnetic core is exposed to a surface of the third resin layer.

4. The module including the planar coil according to claim 1, wherein the second resin layer is a magnetic resin layer including a magnetic filler.

5. The module including the planar coil according to claim 1, wherein the third resin layer is a non-magnetic resin layer, and the planar coil functions as an antenna.

6. The module including the planar coil according to claim 5, wherein the planar coil is configured as an electric power transmission coil of a non-contact type electric power transmission device, and the device is configured as a non-contact type electric power transmission module including the electric power transmission coil and a transmission circuit, or the electric power transmission coil and a reception circuit.

7. The module including the planar coil according to claim 1, wherein the third resin layer is a magnetic resin layer, and the planar coil defines an inductor.

8. The module including the planar coil according to claim 7, wherein the planar coil defines an inductor of a filter circuit including the inductor and a capacitor.

* * * * *